United States Patent
Gargaro et al.

(10) Patent No.: US 11,205,439 B2
(45) Date of Patent: Dec. 21, 2021

(54) REGULATING SPEECH SOUND DISSEMINATION

(71) Applicant: International Business Machines Corporation, Armonk, NY (US)

(72) Inventors: Gianluca Gargaro, Rome (IT); Matteo Rogante, Rome (IT); Angela Ghidoni, Soresina (IT); Sara Moggi, Pomezia (IT)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 16/691,973

(22) Filed: Nov. 22, 2019

(65) Prior Publication Data
US 2021/0158829 A1 May 27, 2021

(51) Int. Cl.
*G10L 15/08* (2006.01)
*G10L 15/20* (2006.01)
(Continued)

(52) U.S. Cl.
CPC ............ *G10L 21/034* (2013.01); *G10L 15/22* (2013.01); *G10L 25/51* (2013.01); *G10L 25/78* (2013.01);
(Continued)

(58) Field of Classification Search
CPC ... G10L 25/69; G10L 21/0364; G10L 19/012; G10L 15/20; H04R 2225/43
(Continued)

(56) References Cited

U.S. PATENT DOCUMENTS 6,751,592 B1 * 6/2004 Shiga ...................... G10L 13/07
704/258
7,643,640 B2 * 1/2010 Jorgensen ............... G09B 23/14
381/61
(Continued)

FOREIGN PATENT DOCUMENTS

CN 104575486 A 4/2015
RU 2155453 C1 8/2000

OTHER PUBLICATIONS

Donley et al., "Improving Speech Privacy in Personal Sound Zones", ICASSP 2016, pp. 311-315.
(Continued)

*Primary Examiner* — George C Monikang
(74) *Attorney, Agent, or Firm* — Jamar K. Ray (57) ABSTRACT

A method includes obtaining first audio data corresponding to speech occurring within a communication area. The first audio data is obtained from one or more interior locations inside the communication area. The method includes obtaining second audio data corresponding to the speech. The second audio data is obtained from one or more exterior locations outside of the communication area. The method includes calculating a first intelligibility based on the first audio data and calculating a second intelligibility based on the second audio data. The method includes comparing the first intelligibility to the second intelligibility, and determining, based on the comparing, that the second intelligibility exceeds a threshold. The method includes generating a set of countermeasures in response to the determining. The set of countermeasures includes at least one modification to a parameter of the speech. The method includes providing at least one countermeasure of the set of countermeasures.

17 Claims, 6 Drawing Sheets

(51) Int. Cl.
　　　*G10L 25/87*　　(2013.01)
　　　*G06F 3/16*　　(2006.01)
　　　*G10L 21/034*　　(2013.01)
　　　*H04R 1/40*　　(2006.01)
　　　*H04R 3/00*　　(2006.01)
　　　*G10L 15/22*　　(2006.01)
　　　*G10L 25/78*　　(2013.01)
　　　*H04R 1/32*　　(2006.01)
　　　*G10L 25/51*　　(2013.01)
　　　*H04L 12/28*　　(2006.01)
　　　*H04B 1/3827*　　(2015.01)

(52) U.S. Cl.
　　　CPC ............. *H04R 1/323* (2013.01); *H04R 1/406* (2013.01); *H04R 3/005* (2013.01); *H04B 1/3827* (2013.01); *H04L 12/28* (2013.01)

(58) Field of Classification Search
　　　USPC ........................................ 704/200, 233, 251
　　　See application file for complete search history.

(56) References Cited

U.S. PATENT DOCUMENTS

| | | |
|---|---|---|
| 8,917,186 B1 | 12/2014 | Grant |
| 9,711,131 B2 | 7/2017 | Christoph |
| 2009/0097671 A1 | 4/2009 | Paradiso et al. |
| 2015/0057999 A1 | 2/2015 | Leorin et al. |
| 2015/0358756 A1* | 12/2015 | Harma .................... H04S 7/302 381/17 |
| 2016/0196818 A1* | 7/2016 | Christoph ................ H04K 3/43 381/71.6 |
| 2019/0043338 A1 | 2/2019 | Scheper et al. |
| 2020/0105291 A1* | 4/2020 | Sheaffer .................. H04R 3/10 |

OTHER PUBLICATIONS

Mell et al., "The NIST Definition of Cloud Computing", Recommendations of the National Institute of Standards and Technology, Sep. 2011, 7 pages.

* cited by examiner

REGULATING SPEECH SOUND DISSEMINATION

BACKGROUND

The present disclosure relates to sound control, and more specifically, to regulating speech sound dissemination.

Environments such as workspaces can include areas that are configured to reduce sound dissemination beyond those areas. For example, office rooms and/or meeting rooms can include walls and doors that are designed to reduce the extent to which sounds can pass from inside to outside of such rooms. These measures can be implemented to preserve the confidentiality of discussions that take place within the rooms.

SUMMARY

According to embodiments of the present disclosure, a method can include obtaining first audio data corresponding to speech occurring within a communication area. The first audio data can be obtained from one or more interior locations inside the communication area. The method can further include obtaining second audio data corresponding to the speech. The second audio data can be obtained from one or more exterior locations outside of the communication area. The method can further include calculating a first intelligibility based on the first audio data. The method can further include calculating a second intelligibility based on the second audio data. The method can further include comparing the first intelligibility to the second intelligibility. The method can further include determining, based on the comparing, that the second intelligibility exceeds a threshold. The method can further include generating a set of countermeasures in response to the determining. The set of countermeasures can include at least one modification to a parameter of the speech. The method can further include providing at least one countermeasure of the set of countermeasures.

A system and a computer program product corresponding to the above method are also included herein.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to sound control; more particular aspects relate to regulating speech sound dissemination. While the present disclosure is not necessarily limited to such applications, various aspects of the disclosure may be appreciated through a discussion of various examples using this context.

Areas such as office rooms and meeting rooms can be places where confidential and/or private discussions occur. To provide confidential and/or private spaces, such areas can be configured with static countermeasures, such as doors and/or walls that can reduce the propagation of sound from inside these areas to outside these areas. These static countermeasures can be designed to address a fixed parameter, such as a specific range of sound frequencies whose propagation through a wall or door can be reduced. However, static countermeasures can be ineffective in some scenarios. For example, during a conference call, a telephone speaker may be operated at an increased volume and/or a conference call participant may speak at an increased volume in order to communicate effectively during the conference call. Additionally, in some instances, a telephone speaker and a conference call participant can be located a short distance from a wall or door which can reduce the effectiveness of a static countermeasure, such as a sheet of a soundproofing material. Furthermore, in some instances, static countermeasures, such as those discussed above, can require labor-intensive structural modifications to a facility.

To address these and other issues, embodiments of the present disclosure include a sound regulation system that can generate a set of dynamic countermeasures to reduce the propagation of sound from inside a communication area to outside of the communication area. The set of dynamic countermeasures can be based, at least in part, on first audio data obtained in real time from one or more locations inside the communication area and second audio data obtained in real time from one or more locations outside of the communication area. By utilizing the first audio data and the second audio data, embodiments of the present disclosure can tailor a set of countermeasures in real time, according to the content of communication that can propagate from inside to outside of the communication area. Additionally, by utilizing the first audio data and the second audio data, embodiments of the present disclosure can tailor a set of countermeasures in real time, according to the clarity of communication that can propagate from the inside to the outside of the communication area. Accordingly, embodiments of the present disclosure can improve an ability to provide confidential communication areas. Additionally, embodiments of the present disclosure may not can require labor-intensive structural modifications to a facility.

Figure 1:
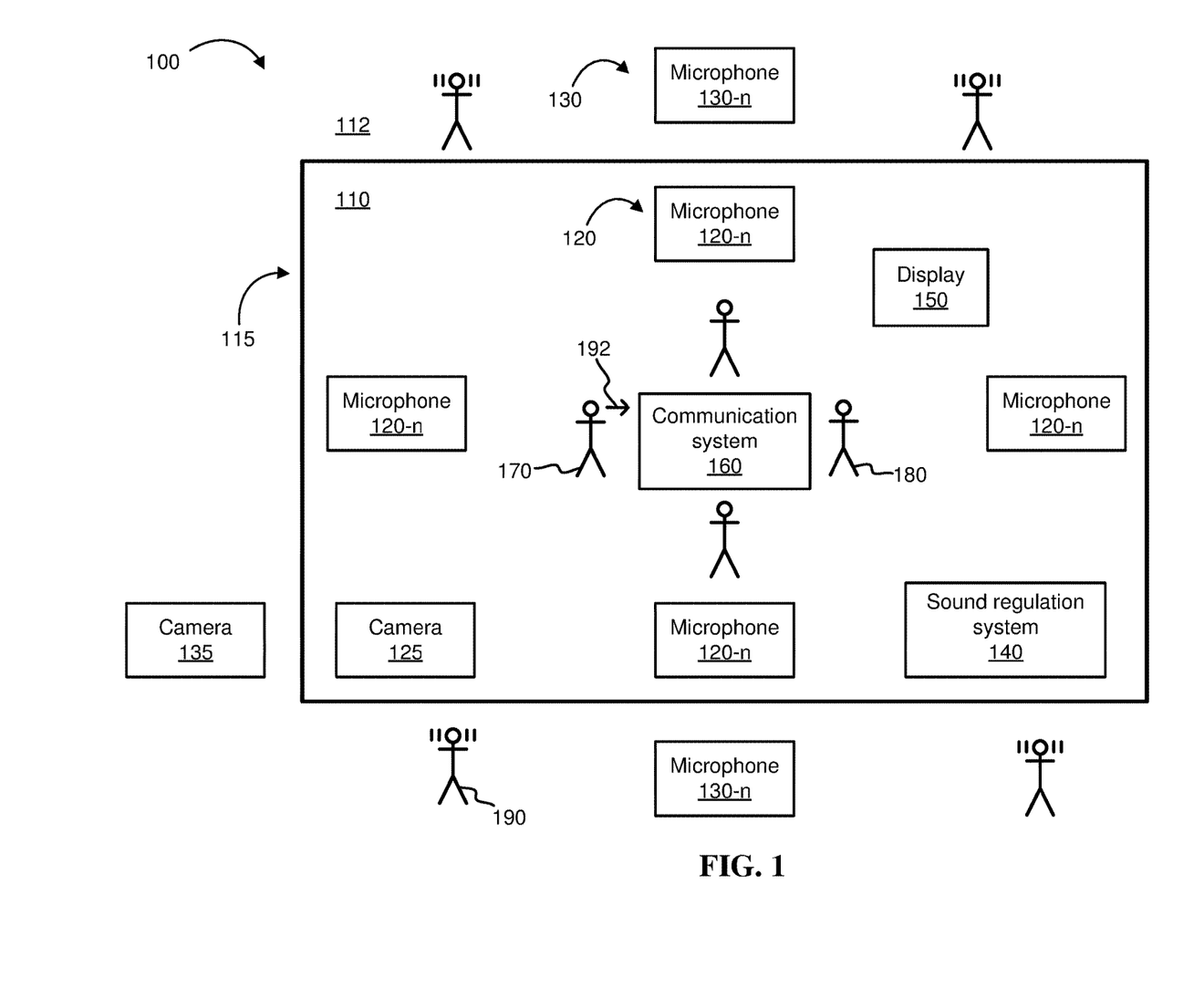
FIG. 1 depicts an example environment in which a sound regulation system can be used, in accordance with embodiments of the present disclosure.

Turning to the figures, FIG. 1 illustrates an example computing environment 100, such as an office environment, in which a sound regulation system 140 can be used. The computing environment 100 can include a communication area 110. The communication area 110 can include an area where discussions can take place, such as an office room or a meeting room. The communication area 110 can be enclosed by a set of structures 115, such as walls, doors, windows, and/or a ceiling. In some embodiments, the communication area 110 can include a communication system 160, a sound regulation system 140, at least one interior listener 180, and/or at least one interior speaker 170. In some embodiments, the communication system 160 can include a communication device, such as a telephone or teleconferencing equipment that includes a speakerphone. In some embodiments, the communication system 160 can be used to conduct a discussion with one or more callers in one or more remote locations (e.g., offices in different cities). In some embodiments, an interior listener 180 can include a person who is located inside the communication area 110 and who can potentially hear speech occurring within the communication area 110. In some embodiments, an interior speaker 170 can include a person who is speaking inside the communication area 110 in a speaking direction 192. In some embodiments, the speaking direction 192 can include a direction in which speech is propagated. For example, in some embodiments, an interior speaker 170 can be located on a left side of the communication area 110 and project speech to at least one interior listener 180 on a right side of the communication area 110; thus, in this example, the speaking direction 192 can be a direction from left to right.

An exterior area 112 can include an area adjacent to the communication area 110 and outside of the set of structures 115 that can enclose the communication area 110. For example, in some embodiments, an exterior area 112 can include a hallway, lobby, room, or outdoor space. In some embodiments, the exterior area 112 can include an area proximate a communication area 110, such as an area within approximately 10 meters (m) of a structure, such as a wall, of a set of structures 115 that enclose the communication area 110. In some embodiments, at least one exterior listener 190 can be present in the exterior area 112. An exterior listener 190 can include a person who can potentially hear speech occurring within the communication area 110 from the exterior area 112.

In some embodiments, the sound regulation system 140 can include a display 150, a set of interior microphones 120 (e.g., a set of microphones having an interior location inside the communication area 110), and a set of exterior microphones 130 (e.g., a set of microphones having an exterior location outside of the communication area 110). The set of interior microphones 120 can include one or more interior microphones. For example, in some embodiments, the set of interior microphones 120 can include n interior microphones, where n is an integer greater than zero. For example, n=1 in embodiments in which the set of interior microphones 120 includes only a first interior microphone 120-1; n=2 in embodiments in which the set of interior microphones 120 includes two interior microphones (a first interior microphone 120-1 and a second interior microphone 120-2); and so on. Similarly, the set of exterior microphones 130 can include one or more exterior microphones 130-$n$, according to the nomenclature discussed above. In some embodiments, the set of interior microphones 120 and the set of exterior microphones 130 can be configured to obtain audio data in a manner such as that described in step 210 with respect to FIG. 2.

Referring back to FIG. 1, in some embodiments, the sound regulation system 140 can include at least one interior camera 125 located in the communication area 110. The at least one interior camera 125 can be configured to capture images of people (e.g., interior speaker 170 and/or interior listener 180) and/or objects (e.g., communication system 160) in the communication area 110. In these embodiments, the at least one interior camera 125 can communicate with the sound regulation system 140 and transfer images to the sound regulation system 140. Furthermore, in these embodiments, the sound regulation system 140 can include a processor configured with image processing technology. The sound regulation system 140 can use such image processing technology to identify a location of one or more of an interior speaker 170, interior listener 180, or a communication system 160.

In some embodiments, the sound regulation system 140 can include at least one exterior camera 135 located in the exterior area 112. The at least one exterior camera 135 can be configured to capture images of people (e.g., at least one exterior listener 190) and objects in the exterior area 112. In these embodiments, similar to the embodiment discussed above, the sound regulation system 140 can obtain such images from the at least one exterior camera 135 and use image processing technology to identify a location of at least one exterior listener 190. In these embodiments, the sound regulation system can identify exterior listeners who can be in an intelligible region (discussed below with respect to FIG. 3).

Figure 2:
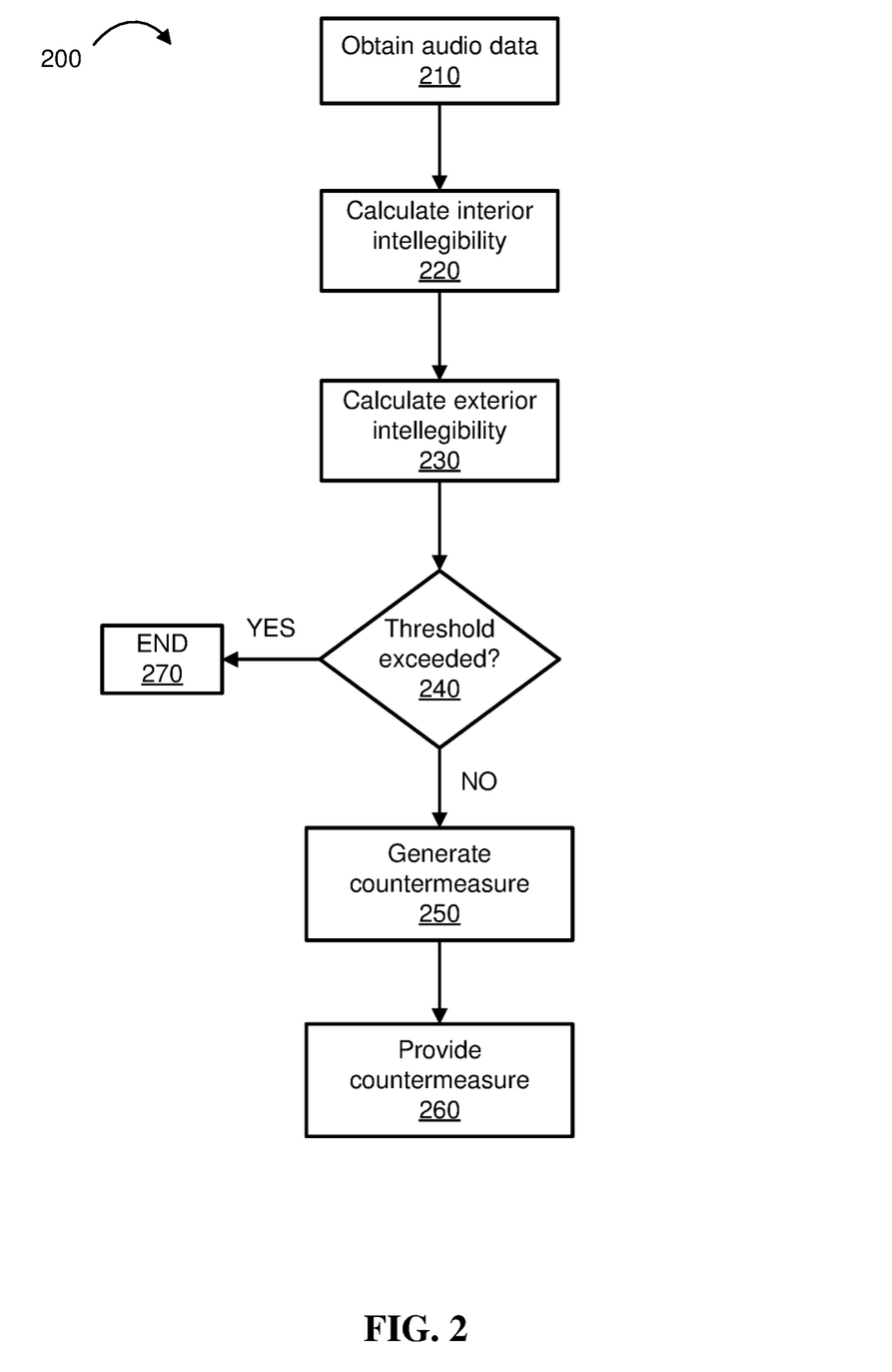
FIG. 2 depicts a flowchart of an example method for regulating external sound propagation, in accordance with embodiments of the present disclosure.

In some embodiments, the sound regulation system 140 can include one or more processors configured to perform one or more of the method steps described with respect to FIG. 2. In some embodiments, the sound regulation system 140 can include a computer system that is identical or substantially similar to the computer system 401 described with respect to FIG. 4. In some embodiments, the sound regulation system 140 can be configured to communicate with the set of interior microphones 120, the set of exterior microphones 130, the at least one interior camera 125, the at least one exterior camera 135, and/or the display 150, through a network, such as a wide area network (WAN), a local area network (LAN), the Internet, or an intranet. In some embodiments, such a network can be substantially similar to, or the same as, cloud computing environment 50 described in FIG. 5.

Referring back to FIG. 1, in some embodiments, the display 150 can include a screen or monitor in communication with the sound regulation system 140. In some embodiments, the display 150 can provide a visualization of a countermeasure generated by the sound regulation system 140, such as the visualization 300, discussed with respect to FIG. 3.

FIG. 2 illustrates a flowchart of an example method 200 for generating a set of countermeasures to regulate external sound propagation, in accordance with embodiments of the present disclosure. Method 200 can be performed by a sound regulation system, such as the sound regulation system 140 discussed with respect to FIG. 1.

Referring back to FIG. 2, in step 210, the sound regulation system can obtain audio data. Audio data can include information such as one or more audio signals, parameters corresponding to one or more audio signals (e.g., volume, frequency, source location, direction of sound propagation, etc.), and one or more predetermined thresholds (e.g., a threshold corresponding to intelligibility, discussed in further detail below). In some embodiments, step 210 can include the sound regulation system receiving first audio data (e.g., one or more audio signals from a set of interior microphones, such as the set of interior microphones 120 discussed with respect to FIG. 1) and second audio data (e.g., one or more audio signals from a set of exterior microphones, such as the set of exterior microphones 130 discussed with respect to FIG. 1).

In some embodiments, step 210 can include the sound regulation system implementing audio analysis technology to identify one or more parameters of one or more obtained audio signals. For example, in some embodiments, using audio analysis technology, the sound regulation system can identify one or more spoken words, volumes, frequencies, and/or background noise in one or more obtained audio signals. In some embodiments, the sound regulation system can obtain a set of audio signals from three or more interior microphones within a communication area and utilize technology such as sound triangulation methods to determine a location of the source of the set of audio signals within the communication area. In some embodiments, the sound regulation system can utilize audio analysis technology to estimate a direction of sound propagation from the source of the sound. In some embodiments, the sound regulation system can obtain audio data from a storage location, such as from memory included in a computer system of the sound regulation system. For example, the sound regulation system can include memory that stores data such as threshold values and/or previously obtained audio data. In some embodiments, step 210 can include obtaining audio data continuously. In some embodiments, step 210 can include obtaining audio data intermittently.

In step 220, the sound regulation system can calculate an interior intelligibility. In some embodiments, intelligibility can refer to a value that represents both a significance of a set of words identified in an audio signal and a sound clarity of the set of words at a listening location. In some embodiments, intelligibility can have the following time-dependent relationship:

$$I(t)=WS(t)*C(t) \quad (1), \text{where:}$$

I(t) is an intelligibility value, WS(t) is a word significance value that corresponds to a significance of a set of words identified in an audio signal, C(t) is a degree of clarity value that corresponds to a degree of sound clarity of the set of words, and t is a time or a time period.

In some embodiments, the degree of clarity can have the following time-dependent relationship:

$$C(t)=V(t)-N(t) \quad (2), \text{where:}$$

V(t) is a volume of a set of words identified in an audio signal, N(t) is a volume of background noise identified in an audio signal, and t is a time or a time period. In some embodiments, an interior intelligibility can correspond to first audio data (e.g., a set of words identified in an audio signal from a set of interior microphones and a sound clarity of the set of words at an interior listening location (e.g., a listening location inside a communication area)).

In some embodiments, the word significance value, WS(t), can represent a value assigned to the information conveyed in a set of words identified in an audio signal. For example, if the sound regulation system identified the set of words, "the first . . . is . . . on the . . . by the second," then the sound regulation system can assign the set of words a relatively low word significance value (e.g., a value of 2 on a scale of 1 to 10, where 1 is a lowest value and 10 is a highest value). In this example, the relatively low word significance value can indicate that the information included in the set of words is not deemed significant by the sound regulation system, as the set of words primarily includes articles, prepositions, and adjectives, and it does not convey a grammatically complete sentence. In a contrasting example, if the sound regulation system identified the set of words, "we have five more days to consider the offer from Company A," then the sound regulation system can assign the set of words a relatively high word significance value (e.g., a value greater than 5 on the scale discussed above). In this example, the relatively high word significance value can indicate that the information included in the set of words is deemed significant by the sound regulation system, as the set of words includes a complete sentence regarding a proper noun (i.e., Company A).

In some embodiments, the sound regulation system can calculate a word significance value based, at least in part, on a confidentiality value associated with the word. For example, in some embodiments, a predetermined set of words associated with potentially confidential information can be assigned a relatively high numeric value (e.g., a value greater than 5 on the scale discussed above). In these embodiments, the word significance value can be equivalent to the confidentiality value for the predetermined set of words (e.g., words such as health, sickness, price, deal, offer, etc.).

In some embodiments, the sound regulation system can calculate word significance values using keyword extractions and/or tools such as rapid automatic keyword extraction (RAKE) or term frequency-inverse document frequency (TF-IDF). In some embodiments, the word significance value can be calculated by one or more processors included in the sound regulation system configured with speech recognition technology, natural language processing (NLP) technology, and machine learning models that are trained to predict a significance of a set of words.

Machine learning algorithms can include, but are not limited to, decision tree learning, association rule learning, artificial neural networks, deep learning, inductive logic programming, support vector machines, clustering, Bayesian networks, reinforcement learning, representation learning, similarity/metric training, sparse dictionary learning, genetic algorithms, rule-based learning, and/or other machine learning techniques.

For example, the machine learning algorithms can utilize one or more of the following example techniques: K-nearest neighbor (KNN), learning vector quantization (LVQ), self-organizing map (SOM), logistic regression, ordinary least squares regression (OLSR), linear regression, stepwise regression, multivariate adaptive regression spline (MARS), ridge regression, least absolute shrinkage and selection operator (LASSO), elastic net, least-angle regression (LARS), probabilistic classifier, naïve Bayes classifier, binary classifier, linear classifier, hierarchical classifier, canonical correlation analysis (CCA), factor analysis, independent component analysis (ICA), linear discriminant analysis (LDA), multidimensional scaling (MDS), non-negative metric factorization (NMF), partial least squares regression (PLSR), principal component analysis (PCA), principal component regression (PCR), Sammon mapping, t-distributed stochastic neighbor embedding (t-SNE), bootstrap aggregating, ensemble averaging, gradient boosted decision tree (GBRT), gradient boosting machine (GBM), inductive bias algorithms, Q-learning, state-action-reward-state-action (SARSA), temporal difference (TD) learning, apriori algorithms, equivalence class transformation (ECLAT) algorithms, Gaussian process regression, gene expression programming, group method of data handling (GMDH), inductive logic programming, instance-based learning, logistic model trees, information fuzzy networks (IFN), hidden Markov models, Gaussian naïve Bayes, multinomial naïve Bayes, averaged one-dependence estimators (AODE), Bayesian network (BN), classification and regression tree (CART), chi-squared automatic interaction detection (CHAID), expectation-maximization algorithm, feed-forward neural networks, logic learning machine, self-organizing map, single-linkage clustering, fuzzy clustering, hierarchical clustering, Boltzmann machines, convolutional neural networks, recurrent neural networks, hierarchical temporal memory (HTM), and/or other machine learning techniques.

In step 230, the sound regulation system can calculate an exterior intelligibility. In some embodiments, an exterior intelligibility can correspond to second audio data (e.g., a set of words identified in an audio signal from a set of exterior microphones and a sound clarity of the set of words at an exterior listening location (e.g., a listening location in an exterior area, such as the exterior area 112 discussed with respect to FIG. 1)). In some embodiments, the sound regulation system can calculate the exterior intelligibility based on equations (1) and (2) discussed above.

In step 240, the sound regulation system can compare intelligibility values and determine whether a threshold is exceeded. For example, in some embodiments, step 240 can include the sound regulation system comparing an interior intelligibility value to an exterior intelligibility value and determining whether the values are within a threshold range of one another. For example, in some embodiments, the sound regulation system can calculate an interior intelligibility value of 8.0, on a scale of 1 to 10. Continuing with this example, the sound regulation system can calculate an exterior intelligibility value of 7.0. Thus, in this example, the sound regulation system can determine that the percentage difference (i.e., 13.33%) between the two values does not exceed a threshold of 25%. Accordingly, in this example, the fact that the percentage difference does not exceed the threshold can indicate that speech deemed significant by the sound regulation system is propagating into an exterior area with a degree of sound clarity that is sufficient to be understood by an exterior listener. Accordingly, if the threshold is not exceeded, then the sound regulation system can proceed to generate a countermeasure in step 250. However, in another example, if the sound regulation system determines that the percentage difference exceeds a threshold, such as a 25% percentage difference threshold, then the sound regulation system can proceed to step 270 and end an iteration of the method 200. In this example, the fact that the percentage difference exceeds the threshold can indicate that the sound regulation system does not deem the speech significant and/or the speech does not propagate into an exterior area with a degree of sound clarity sufficient to be understood by an exterior listener.

In step 250, the sound regulation system can generate a set of countermeasures. In some embodiments, a set of countermeasures can include at least one of changing a location of a sound source (e.g., an interior speaker or a communication system), changing a direction in which speech is projected, and/or lowering a volume of speech (e.g., reducing a speaking volume or a volume of a communication system).

In step 260, the sound regulation system can provide the set of countermeasures. In some embodiments, step 260 can include the sound regulation system providing a visualization of a set of countermeasures, such as the visualization discussed with respect to FIG. 3

Figure 3:
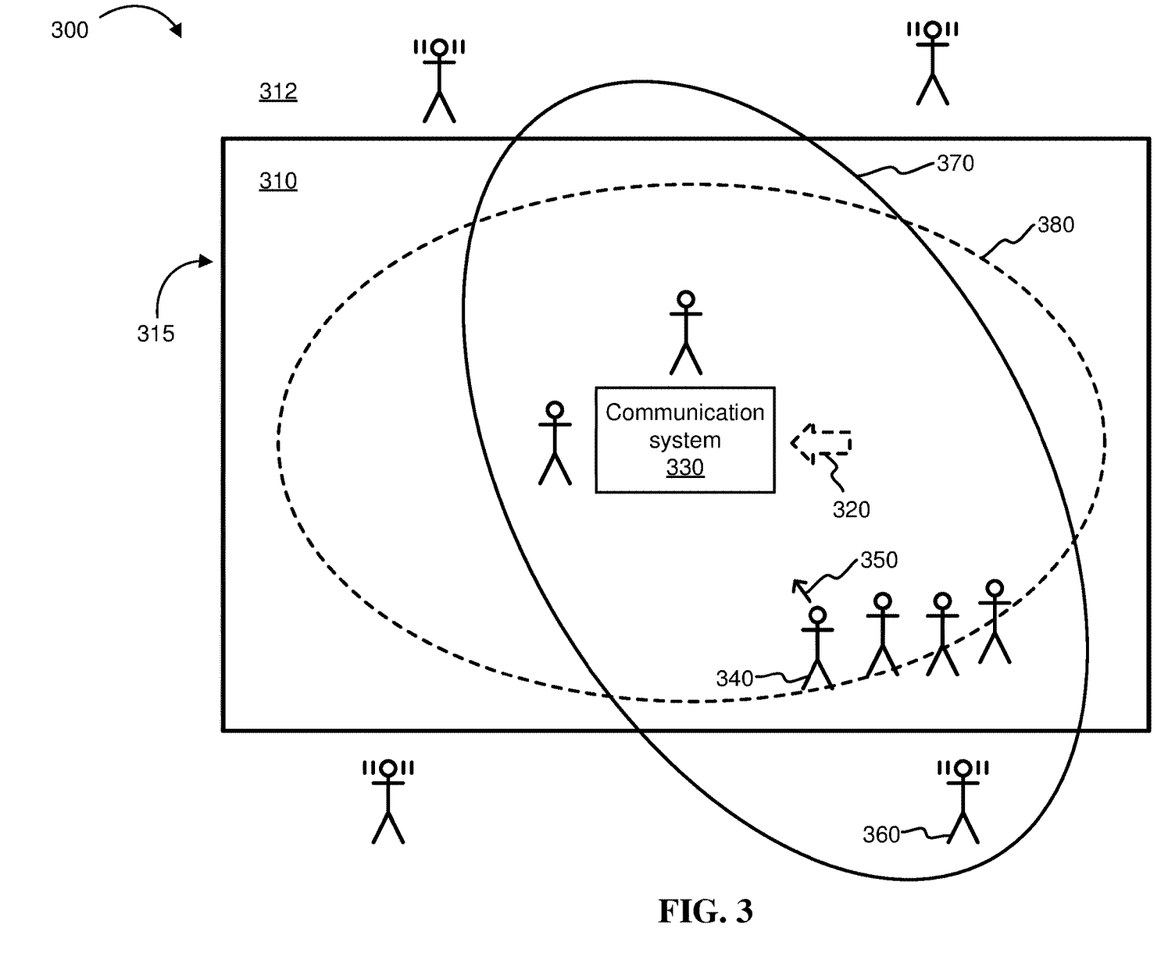
FIG. 3 depicts an example visualization that can be generated by a sound regulation system, in accordance with embodiments of the present disclosure.

FIG. 3 illustrates an example visualization 300 that can be generated by a sound regulation system, in accordance with embodiments of the present disclosure. In some embodiments, visualization 300 can be presented on a display, such as a screen or a monitor maintained in a communication area. In some embodiments, visualization 300 can be presented on a screen of one or more computing devices (e.g., mobile phones, tablets, laptop computers, etc.). In some embodiments, visualization 300 can show present values that approximate a present state of sound propagation and projected values that approximate a predicted state of sound propagation according to a set of countermeasures. For example, in visualization 300, present values can include an identified speech source 340 and direction of speech propagation 350, a present intelligible region 370 that indicates a region in which the speech can have a degree of sound clarity that is sufficient to be understood, and one or more external listeners 360 who may be within the present intelligible region 370. Further in this example, the visualization 300 can show a predicted intelligible region 380 that corresponds with a countermeasure speech source location and direction 320. In some embodiments, the visualization 300 can include features such as a communication system 330, a set of structures 315 that enclose a communication area 310, and an exterior area 312. By providing a visualization, such as visualization 300, embodiments of the present disclosure can facilitate the implementation of one or more countermeasures that can reduce or eliminate external sound propagation.

Figure 4:
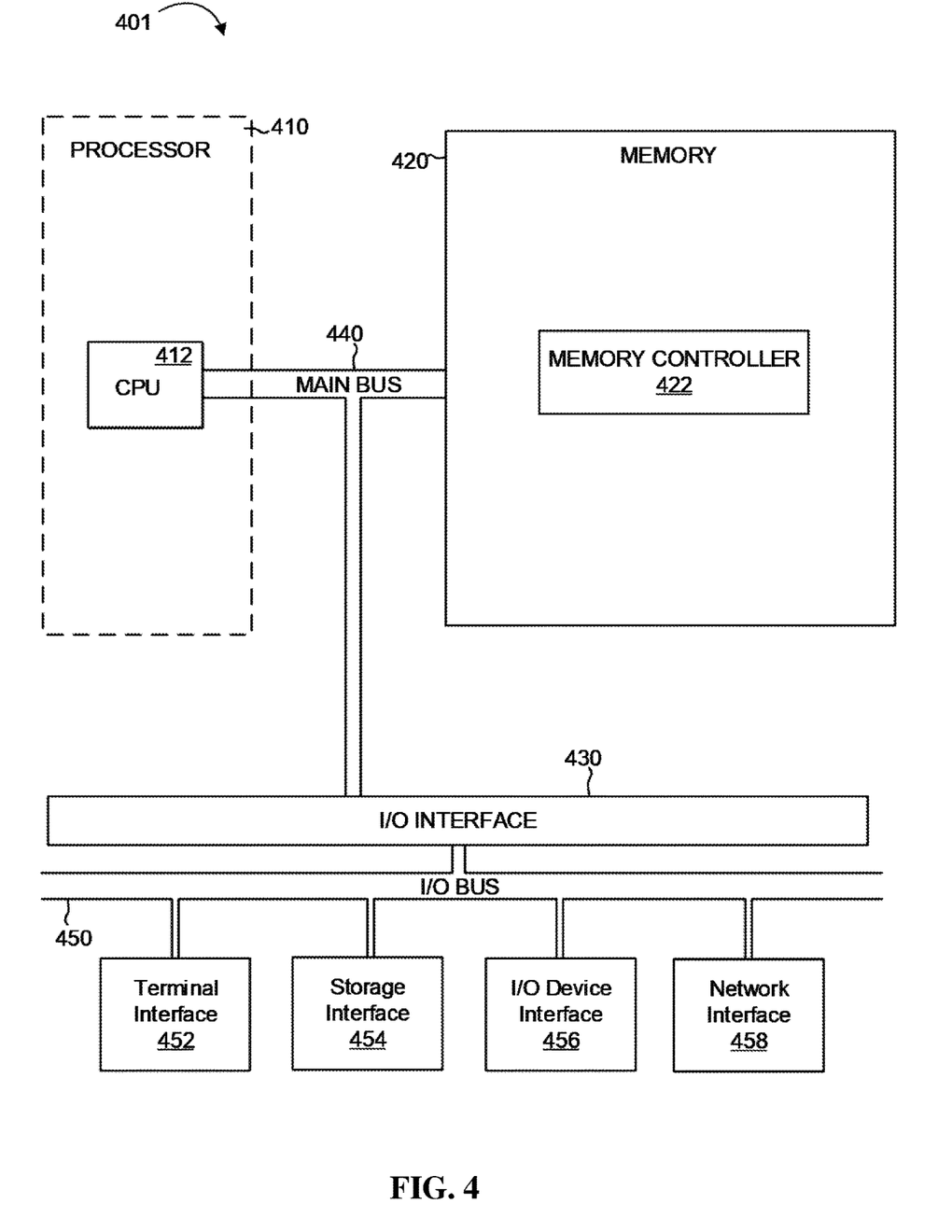
FIG. 4 depicts the representative major components of a computer system that can be used in accordance with embodiments of the present disclosure.

FIG. 4 depicts the representative major components of an exemplary Computer System 401 that can be used in accordance with embodiments of the present disclosure. The particular components depicted are presented for the purpose of example only and are not necessarily the only such variations. The Computer System 401 can comprise a Processor 410, Memory 420, an Input/Output Interface (also referred to herein as I/O or I/O Interface) 430, and a Main Bus 440. The Main Bus 440 can provide communication pathways for the other components of the Computer System 401. In some embodiments, the Main Bus 440 can connect to other components such as a specialized digital signal processor (not depicted).

The Processor 410 of the Computer System 401 can be comprised of one or more CPUs 412. The Processor 410 can additionally be comprised of one or more memory buffers or caches (not depicted) that provide temporary storage of instructions and data for the CPU 412. The CPU 412 can perform instructions on input provided from the caches or from the Memory 420 and output the result to caches or the Memory 420. The CPU 412 can be comprised of one or more circuits configured to perform one or methods consistent with embodiments of the present disclosure. In some embodiments, the Computer System 401 can contain multiple Processors 410 typical of a relatively large system. In other embodiments, however, the Computer System 401 can be a single processor with a singular CPU 412.

The Memory 420 of the Computer System 401 can be comprised of a Memory Controller 422 and one or more memory modules for temporarily or permanently storing data (not depicted). In some embodiments, the Memory 420 can comprise a random-access semiconductor memory, storage device, or storage medium (either volatile or non-volatile) for storing data and programs. The Memory Controller 422 can communicate with the Processor 410, facilitating storage and retrieval of information in the memory modules. The Memory Controller 422 can communicate with the I/O Interface 430, facilitating storage and retrieval of input or output in the memory modules. In some embodiments, the memory modules can be dual in-line memory modules.

The I/O Interface 430 can comprise an I/O Bus 450, a Terminal Interface 452, a Storage Interface 454, an I/O Device Interface 456, and a Network Interface 458. The I/O Interface 430 can connect the Main Bus 440 to the I/O Bus 450. The I/O Interface 430 can direct instructions and data from the Processor 410 and Memory 420 to the various interfaces of the I/O Bus 450. The I/O Interface 430 can also direct instructions and data from the various interfaces of the I/O Bus 450 to the Processor 410 and Memory 420. The various interfaces can comprise the Terminal Interface 452, the Storage Interface 454, the I/O Device Interface 456, and the Network Interface 458. In some embodiments, the various interfaces can comprise a subset of the aforementioned interfaces (e.g., an embedded computer system in an industrial application may not include the Terminal Interface 452 and the Storage Interface 454).

Logic modules throughout the Computer System 401—including but not limited to the Memory 420, the Processor 410, and the I/O Interface 430—can communicate failures and changes to one or more components to a hypervisor or operating system (not depicted). The hypervisor or the operating system can allocate the various resources available in the Computer System 401 and track the location of data in Memory 420 and of processes assigned to various CPUs 412. In embodiments that combine or rearrange elements, aspects of the logic modules' capabilities can be combined or redistributed. These variations would be apparent to one skilled in the art.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy, and compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
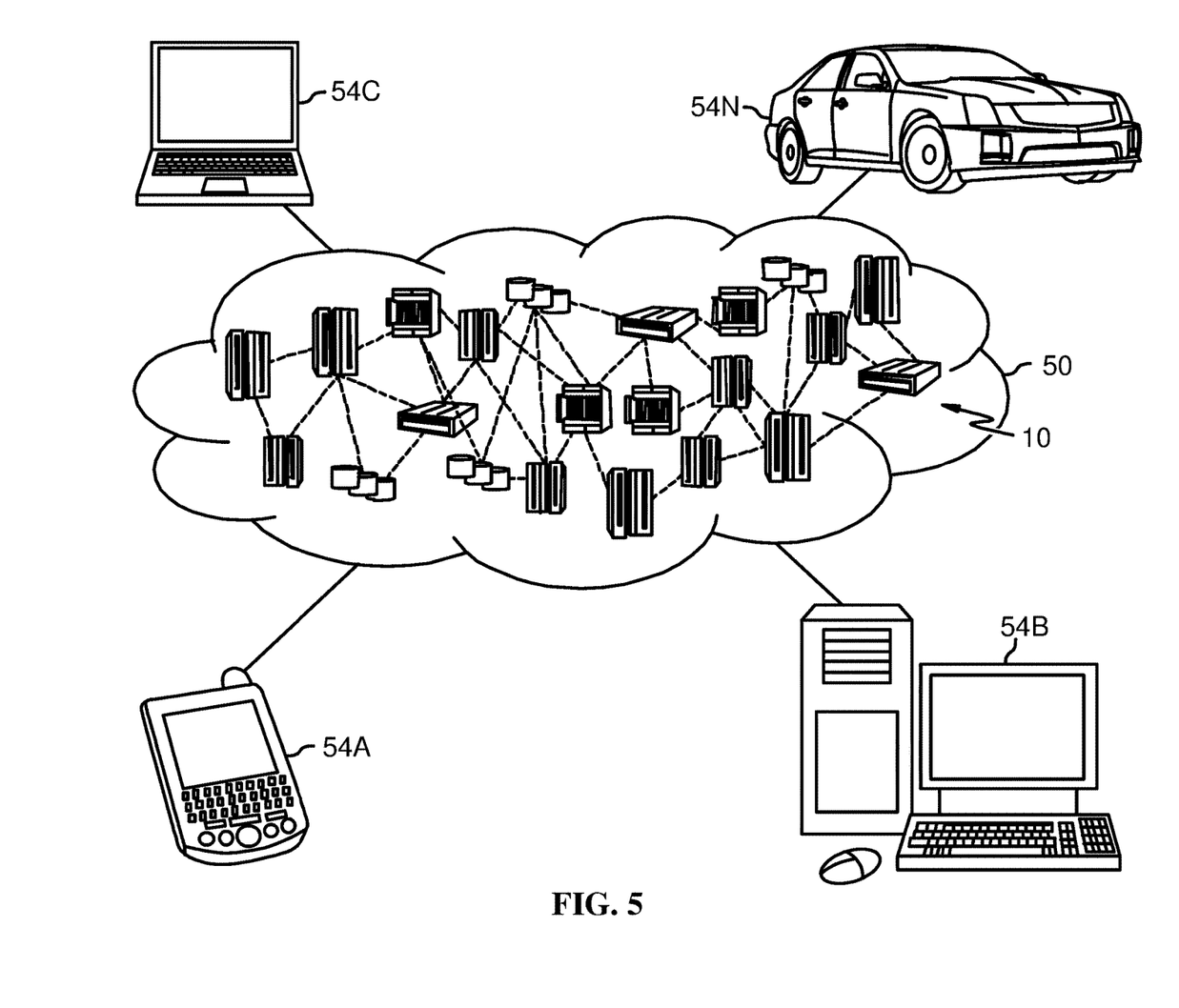
FIG. 5 depicts a cloud computing environment according to embodiments of the present disclosure.

Referring now to FIG. 5, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N can communicate. Nodes 10 can communicate with one another. They can be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment 50 can communicate with any type of computerized device over any type of network and/or network addressable connection (e.g., using a web browser).

Figure 6:
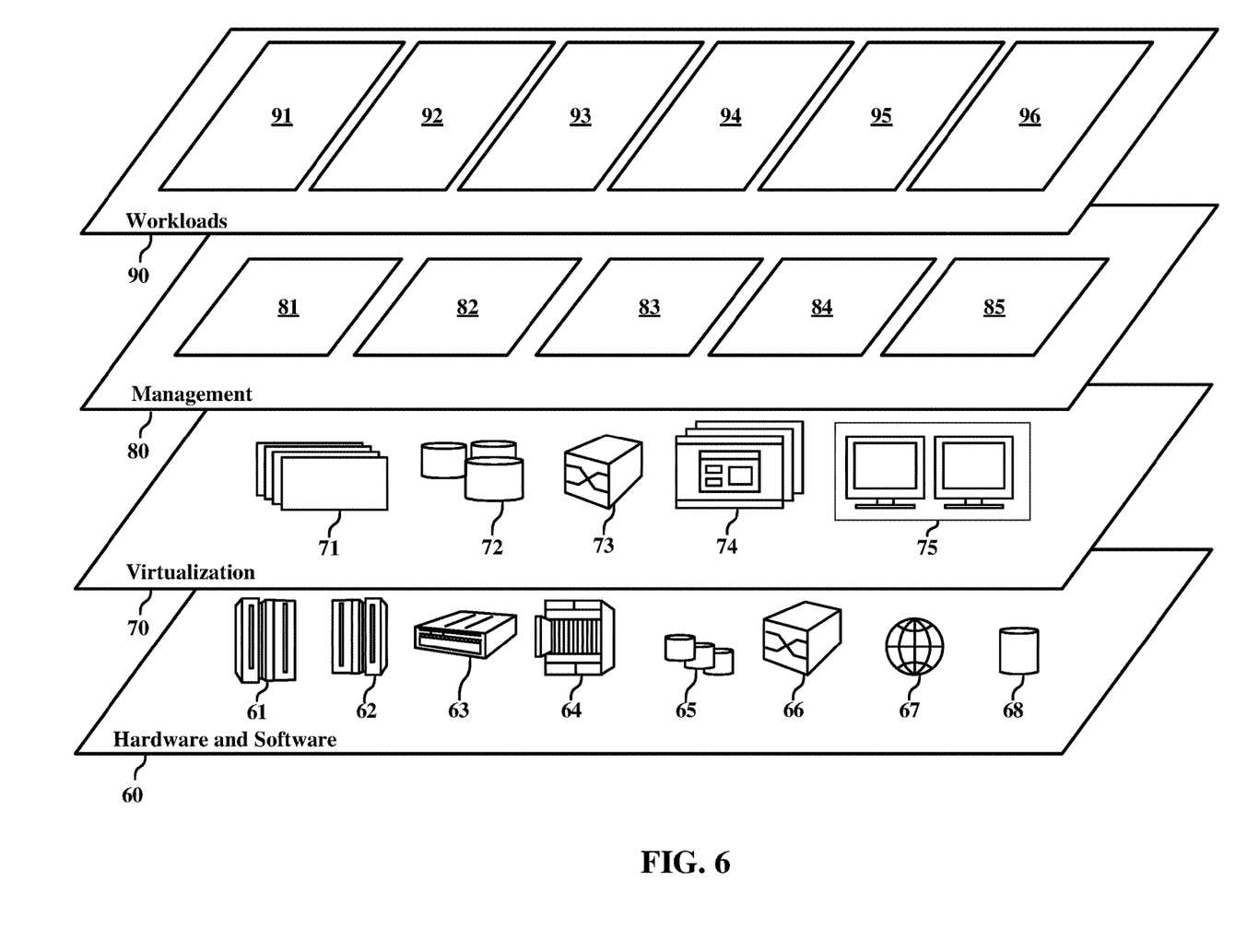
FIG. 6 depicts abstraction model layers according to embodiments of the present disclosure.

Referring now to FIG. 6, a set of functional abstraction layers provided by cloud computing environment 50 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities can be provided: virtual servers 71; virtual storage 72; virtual networks 73, including virtual private networks; virtual applications and operating systems 74; and virtual clients 75.

In one example, management layer 80 can provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources can comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment can be utilized. Examples of workloads and functions which can be provided from this layer include: mapping and navigation 91; software development and lifecycle management 92; virtual classroom education delivery 93; data analytics processing 94; transaction processing 95; and sound regulation logic 96.

As discussed in more detail herein, it is contemplated that some or all of the operations of some of the embodiments of methods described herein can be performed in alternative orders or may not be performed at all; furthermore, multiple operations can occur at the same time or as an internal part of a larger process.

The present invention can be a system, a method, and/or a computer program product. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the block can occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer-implemented method comprising:
    obtaining first audio data corresponding to speech occurring within a communication area,
    wherein the first audio data is obtained from one or more interior locations inside the communication area;
    obtaining second audio data corresponding to the speech,
    wherein the second audio data is obtained from one or more exterior locations outside of the communication area;
    calculating a first intelligibility based on the first audio data;
    calculating a second intelligibility based on the second audio data,
    wherein calculating the second intelligibility includes determining a confidentiality value for one or more words included in the second audio data, the confidentiality value indicating a presence of confidential information in the second audio data;
    comparing the first intelligibility to the second intelligibility;
    determining, based on the comparing, that the second intelligibility exceeds a threshold;
    generating a set of countermeasures in response to the determining, the set of countermeasures comprising at least one modification to a parameter of the speech; and
    generating a visualization that includes a predicted sound propagation corresponding to at least one countermeasure of the set of countermeasures.

2. The computer-implemented method of claim 1, wherein calculating the second intelligibility includes calculating a word significance value.

3. The computer-implemented method of claim 1, wherein calculating the second intelligibility includes calculating a degree of clarity.

4. The computer-implemented method of claim 1, wherein the set of countermeasures comprises changing a location of a source of the speech within the communication area.

5. The computer-implemented method of claim 1, wherein the set of countermeasures comprises modifying a direction in which the speech is projected.

6. The computer-implemented method of claim 1, wherein the set of countermeasures comprises modifying a volume of the speech.

7. A system comprising:
    a processor; and
    a memory in communication with the processor, the memory containing program instructions that, when executed by the processor, are configured to cause the processor to perform a method, the method comprising:
    obtaining first audio data corresponding to speech occurring within a communication area,
    wherein the first audio data is obtained from one or more interior locations inside the communication area;
    obtaining second audio data corresponding to the speech,
    wherein the second audio data is obtained from one or more exterior locations outside of the communication area;
    calculating a first intelligibility based on the first audio data;

calculating a second intelligibility based on the second audio data,
wherein calculating the second intelligibility includes determining a confidentiality value for one or more words included in the second audio data, the confidentiality value indicating a presence of confidential information in the second audio data;
comparing the first intelligibility to the second intelligibility;
determining, based on the comparing, that the second intelligibility exceeds a threshold;
generating a set of countermeasures in response to the determining, the set of countermeasures comprising at least one modification to a parameter of the speech; and
generating a visualization that includes a predicted sound propagation corresponding to at least one countermeasure of the set of countermeasures.

8. The system of claim 7, wherein calculating the second intelligibility includes calculating a word significance value.

9. The system of claim 7, wherein calculating the second intelligibility includes calculating a degree of clarity.

10. The system of claim 7, wherein the set of countermeasures comprises changing a location of a source of the speech within the communication area.

11. The system of claim 7, wherein the set of countermeasures comprises modifying a direction in which the speech is projected.

12. The system of claim 7, wherein the set of countermeasures comprises modifying a volume of the speech.

13. A computer program product comprising a computer readable storage medium having program instructions embodied therewith, wherein the computer readable storage medium is not a transitory signal per se, the program instructions executable by a processor to cause the processor to perform a method, the method comprising:
obtaining first audio data corresponding to speech occurring within a communication area,
wherein the first audio data is obtained from one or more interior locations inside the communication area;
obtaining second audio data corresponding to the speech,
wherein the second audio data is obtained from one or more exterior locations outside of the communication area;
calculating a first intelligibility based on the first audio data;
calculating a second intelligibility based on the second audio data,
wherein calculating the second intelligibility includes determining a confidentiality value for one or more words included in the second audio data, the confidentiality value indicating a presence of confidential information in the second audio data;
comparing the first intelligibility to the second intelligibility;
determining, based on the comparing, that the second intelligibility exceeds a threshold;
generating a set of countermeasures in response to the determining, the set of countermeasures comprising at least one modification to a parameter of the speech,
the set of countermeasures further comprising changing a location of a source of the speech within the communication area; and
providing at least one countermeasure of the set of countermeasures.

14. The computer program product of claim 13, wherein calculating the second intelligibility includes calculating a word significance value.

15. The computer program product of claim 13, wherein calculating the second intelligibility includes calculating a degree of clarity.

16. The computer program product of claim 13, wherein the set of countermeasures comprises modifying a direction in which the speech is projected.

17. The computer program product of claim 13, wherein the set of countermeasures comprises modifying a volume of the speech.

* * * * *